(12) United States Patent
Kubo

(10) Patent No.: US 7,366,019 B2
(45) Date of Patent: *Apr. 29, 2008

(54) NONVOLATILE MEMORY

(75) Inventor: Kazuaki Kubo, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 138 days.

This patent is subject to a terminal disclaimer.

(21) Appl. No.: 11/336,887

(22) Filed: Jan. 23, 2006

(65) Prior Publication Data

US 2006/0120198 A1 Jun. 8, 2006

Related U.S. Application Data

(63) Continuation of application No. 10/965,785, filed on Oct. 18, 2004, now Pat. No. 7,016,231.

(30) Foreign Application Priority Data

Nov. 5, 2003 (JP) .............................. 2003-375375

(51) Int. Cl.
*G11C 16/04* (2006.01)

(52) U.S. Cl. ..................... 365/185.18; 365/189.07; 365/189.09

(58) Field of Classification Search ........... 365/185.18, 365/189.07, 189.09, 189.11, 185.24, 226; 327/536–537
See application file for complete search history.

(56) References Cited

U.S. PATENT DOCUMENTS

| 5,444,663 | A | 8/1995 | Furuno et al. ............... 365/226 |
| 5,615,151 | A | 3/1997 | Furuno et al. ......... 365/185.18 |
| 5,760,614 | A * | 6/1998 | Ooishi et al. .................. 327/77 |
| 5,889,721 | A | 3/1999 | Gannage ...................... 365/226 |
| 5,991,221 | A | 11/1999 | Ishikawa et al. ............. 365/226 |
| 6,351,179 | B1 * | 2/2002 | Ikehashi et al. ............. 327/541 |
| 6,381,185 | B2 * | 4/2002 | Camera et al. .............. 365/201 |
| 6,445,367 | B1 * | 9/2002 | Suzuki et al. .............. 345/75.2 |
| 6,597,603 | B2 | 7/2003 | Lambrache et al. ... 365/185.18 |
| 6,781,256 | B2 * | 8/2004 | Loechner ...................... 307/46 |

FOREIGN PATENT DOCUMENTS

JP 5-12890 1/1993

* cited by examiner

*Primary Examiner*—Gene N. Auduong
(74) *Attorney, Agent, or Firm*—Miles & Stockbridge P.C.

(57) ABSTRACT

There is provided a non-volatile memory capable of being supplied with two varieties of externally supplied voltages, stabilizing the operation thereof, at a voltage in the vicinity of a threshold voltage for switching over between the externally supplied voltages, and stabilizing the operation thereof, at the times of writing and erasing, respectively. The non-volatile memory comprises a power supply circuit incorporating a hysteresis comparator having two voltage levels for the threshold voltage, wherein by detection of 2.3V at a time when an externally supplied voltage rises, a detection signal goes to an "H" level, whereupon an internal step-down circuit, made up of a constant voltage circuit, and so forth, comes into action, generating an internal operation voltage at 2.2V to be subsequently supplied, and thereafter, by detection of 2.1V, the detection signal goes to an "L" level, whereupon the externally supplied voltage, as it is, is supplied as the internal operation voltage. Accordingly, since the detection signal remains in the "H" condition even when the externally supplied voltage is unstable in the vicinity of 2.3V, the internal operation voltage does not undergo variation.

5 Claims, 10 Drawing Sheets

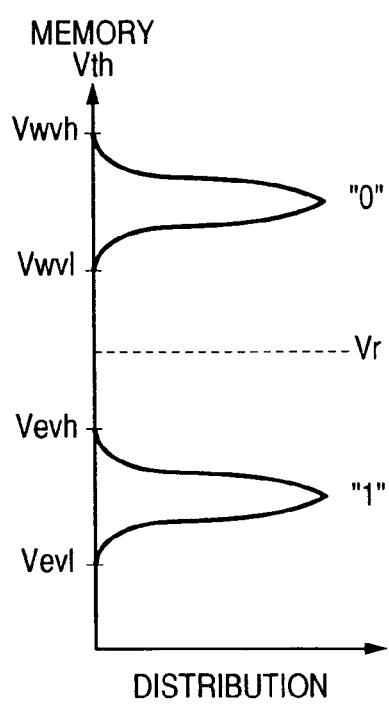 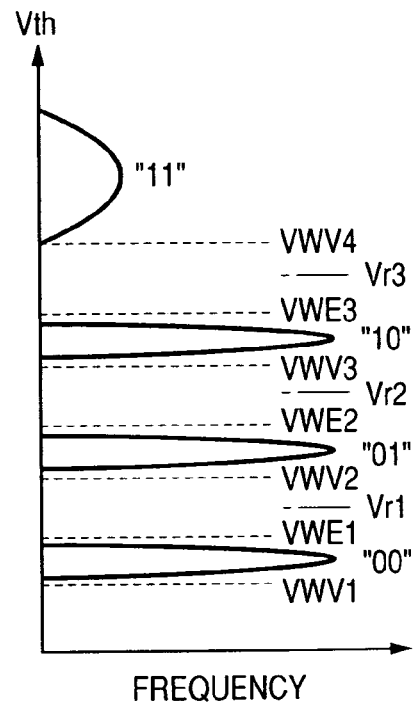
FIG. 3(a)
FIG. 3(b)

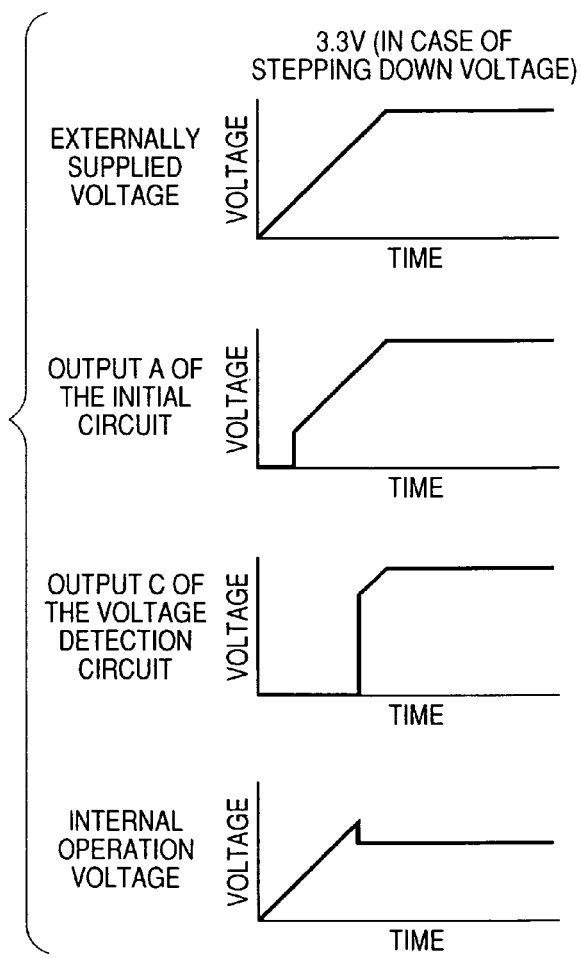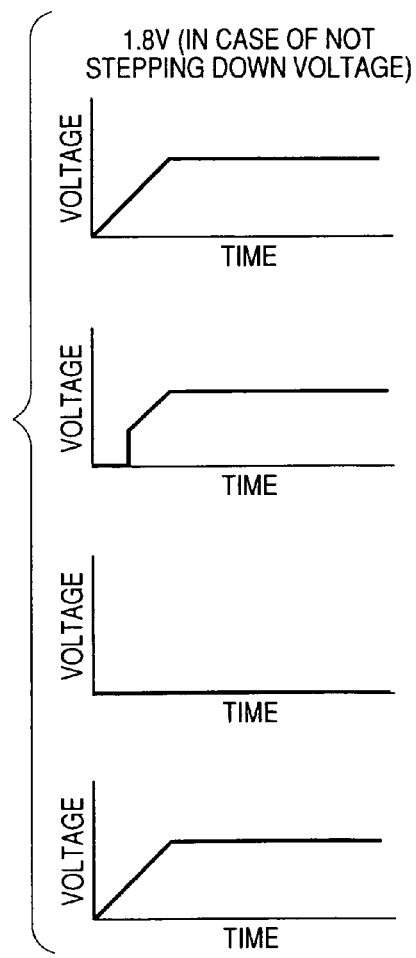
FIG. 6(a)
FIG. 6(b)

| DETECTION SIGNAL | INTERNAL OPERATION VOLTAGE |
|---|---|
| H | THE EXTERNALLY SUPPLIED VOLTAGE IS STEPPED DOWN. |
| L | USE IS MADE OF THE EXTERNALLY SUPPLIED VOLTAGE AS IT IS. |

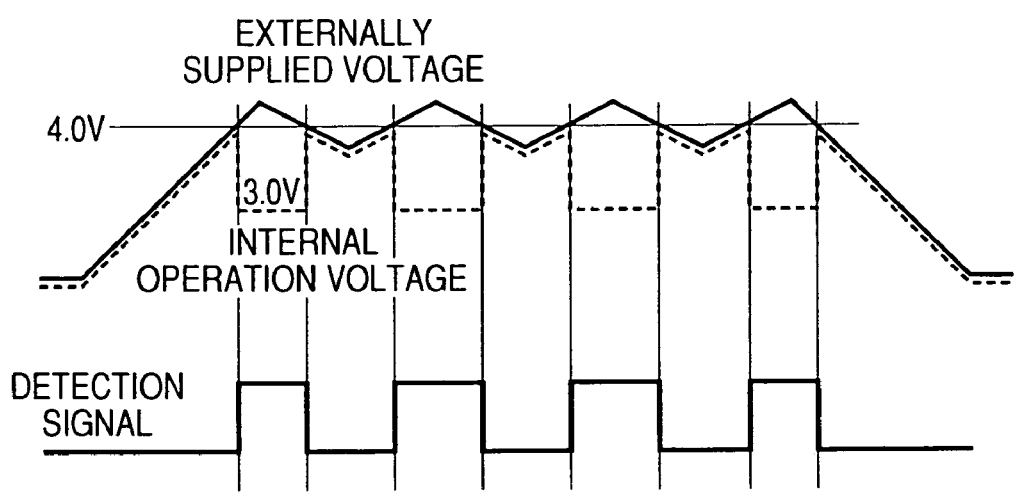

NONVOLATILE MEMORY

CROSS-REFERENCE TO RELATED APPLICATION

This application is a continuation of application Ser. No. 10/965,785 filed Oct. 18, 2004, now U.S. Pat. No. 7,016,231.

CROSS-REFERENCE TO RELATED APPLICATION

The present application claims priority from Japanese patent application No. 2003-375375 filed on Nov. 5, 2003, the content of which is hereby incorporated by reference into this application.

BACKGROUND OF THE INVENTION

The invention relates to a non-volatile memory, and in particular, to a technology effective when applied to a non-volatile memory, such as a flash memory (flash EEPROM), and so forth, capable of being supplied with two varieties of externally supplied voltages.

According to the results of studies conducted by the inventors, the following technology in connection with a non-volatile memory is conceivable.

For example, as for the non-volatile memory capable of being supplied with two varieties of the externally supplied voltages, such a technology as disclosed in Patent Document 1 can be cited. The technology disclosed in Patent Document 1 has a configuration in which two varieties of supplied voltages (Vcc), that is, 5V and 3V are supplied from outside, and internal circuits are arranged to operate with an internal operation voltage at 3V. The internal operation voltage is switched over with a threshold voltage to determine whether the externally supplied voltage is to be stepped down to the internal operation voltage, or to be supplied as the internal operation voltage. The externally supplied voltage is stepped down to 3V and supplied the stepped down voltage to the internal circuit when 5V is supplied as the externally supplied voltage. Or the externally supplied voltage is supplied to the internal circuit when 3V is supplied as the externally supplied voltage. Further, a high voltage (Vpp) necessary for writing and erasing is also supplied from outside.

[Patent Document 1]

Japanese Unexamined Patent Publication No. Hei 5 (1993)-12890

SUMMARY OF THE INVENTION

By the way, the inventors have gained the following knowledge based on the results of their studies conducted on the technology in connection with the non-volatile memory.

For example, with the technology disclosed in Patent Document 1, since switching over between the two varieties of the externally supplied voltages is determined with a single threshold voltage, when the non-volatile memory supplies a voltage in the vicinity of the threshold voltage, a switching operation frequently occurs, so that the operation of the non-volatile memory becomes unstable at times. More specifically, as shown in FIGS. 10(a), and 10(b), when the externally supplied voltage (Vcc) becomes unstable in the vicinity of the threshold voltage at 4V, this will be accompanied by a detection signal going a "H" level when the externally supplied voltage exceeds 4V, and going a "L" level when the externally supplied voltage is not more than 4V, thereby repeating the "H" level, and "L" level, alternately, so that unstableness occurs to a switching operation for determining whether the externally supplied voltage is to be stepped down to generate an internal operation voltage, or the externally supplied voltage, as it is, is to be used as the internal operation voltage.

Further, since the high voltage (Vpp) is supplied from outside, no consideration is given to writing and erasing.

It is therefore an object of the invention to provide a non-volatile memory capable of being supplied with two varieties of externally supplied voltages, and stabilizing the operation thereof, at a voltage in the vicinity of a threshold voltage for switching over between the externally supplied voltages.

Further, another object of the invention is to provide a non-volatile memory capable of stabilizing the operation thereof, at the times of writing and erasing, respectively.

The above and other objects, novel features of the present invention will be apparent from the following description of the specification in conjunction with the accompanying drawings.

Representative ones among the embodiments of the invention, disclosed under the present application, will be broadly and simply described as follows.

The invention is applied to a non-volatile memory capable of being supplied with two varieties of externally supplied voltages, and the non-volatile memory comprises a power supply circuit incorporating a hysteresis comparator, wherein an internal step-down circuit comes into action by detection of a first voltage level at a time when an externally supplied voltage rises, thereby generating an internal operation voltage smaller in absolute value than the first voltage level to be subsequently supplied, and thereafter, by detection of a second voltage level smaller in absolute value than the first voltage level, the externally supplied voltage is supplied as the internal operation voltage.

The non-volatile memory preferably comprises a voltage generation circuit for generating voltages for writing, erasing, verifying, and reading, respectively, based on the internal operation voltage supplied from the power supply circuit. Further, the voltage generation circuit may incorporate a charge pump circuit having a plurality of stages, capable of switching the number of the stages of the charge pump circuit in such a way as to correspond to a first externally supplied voltage level, and a second externally supplied voltage level lower than the first externally supplied voltage level, respectively. With these features, particularly, the first externally supplied voltage level may be at a 3V level and the second externally supplied voltage level may be at a 1.8V level.

Further, the non-volatile memory preferably has a memory array comprising multiple-valued memory cells for storing data of multiple-bits in one memory cell so as to be applied to a multiple-valued non-volatile memory.

Advantageous effects of the representative ones among the embodiments of the invention, disclosed under the present application, will be simply described as follows.

(1) By adoption of the hysteresis comparator having two voltage levels, i.e. a first voltage level and a second voltage level, for the threshold voltage, it is possible to inhibit unstable operation in the vicinity of the threshold voltage at a time of switching over to determine whether the externally supplied voltage is to be stepped down, or the externally supplied voltage, as it is, is to be supplied as the internal operation voltage, so that the operation in the vicinity of the threshold voltage for switching over between the externally supplied voltages can be stabilized.

(2) With the non-volatile memory of a single power supply operation, to which a high voltage is not externally supplied, by generating voltages for writing and erasing, respectively, based on the internal operation voltage, internal voltages particularly at times for writing/erasing, respectively, are stabilized, so that it is possible to stabilize operations at the times for writing/erasing, respectively.

BRIEF DESCRIPTION OF THE DRAWINGS

FIGS. 3(*a*) and 3(*b*) are schematic illustrations showing distribution of threshold voltages in multiple-valued memory cells in the non-volatile memory according to the embodiment 1, in which FIG. 3(*a*) shows a case of 2-valued memory cells as a comparative example, and FIG. 3(*b*) shows a case of 4-valued memory cells;

FIGS. 6(*a*) and 6(*b*) are waveform charts showing the operation of the power supply circuit in the non-volatile memory according to the embodiment 1, in which FIG. 6(*a*) is a waveform chart showing a case of stepping down an externally supplied voltage, and FIG. 6(*b*) is a waveform chart showing a case of not stepping down the externally supplied voltage;

FIGS. 10(*a*), and 10(*b*) are schematic illustrations showing unstableness in operation for switching over between externally supplied voltages in the case of a non-volatile memory according to a comparative example examined prior to development of the present invention, in which FIG. 10(*a*) shows a relationship between a voltage waveform and a detection voltage, and FIG. 10(*b*) shows generation of an internal operation voltage, corresponding to levels of the detection voltage.

DETAILED DESCRIPTION OF THE PREFERRED EMBODIMENTS

Figure 1:
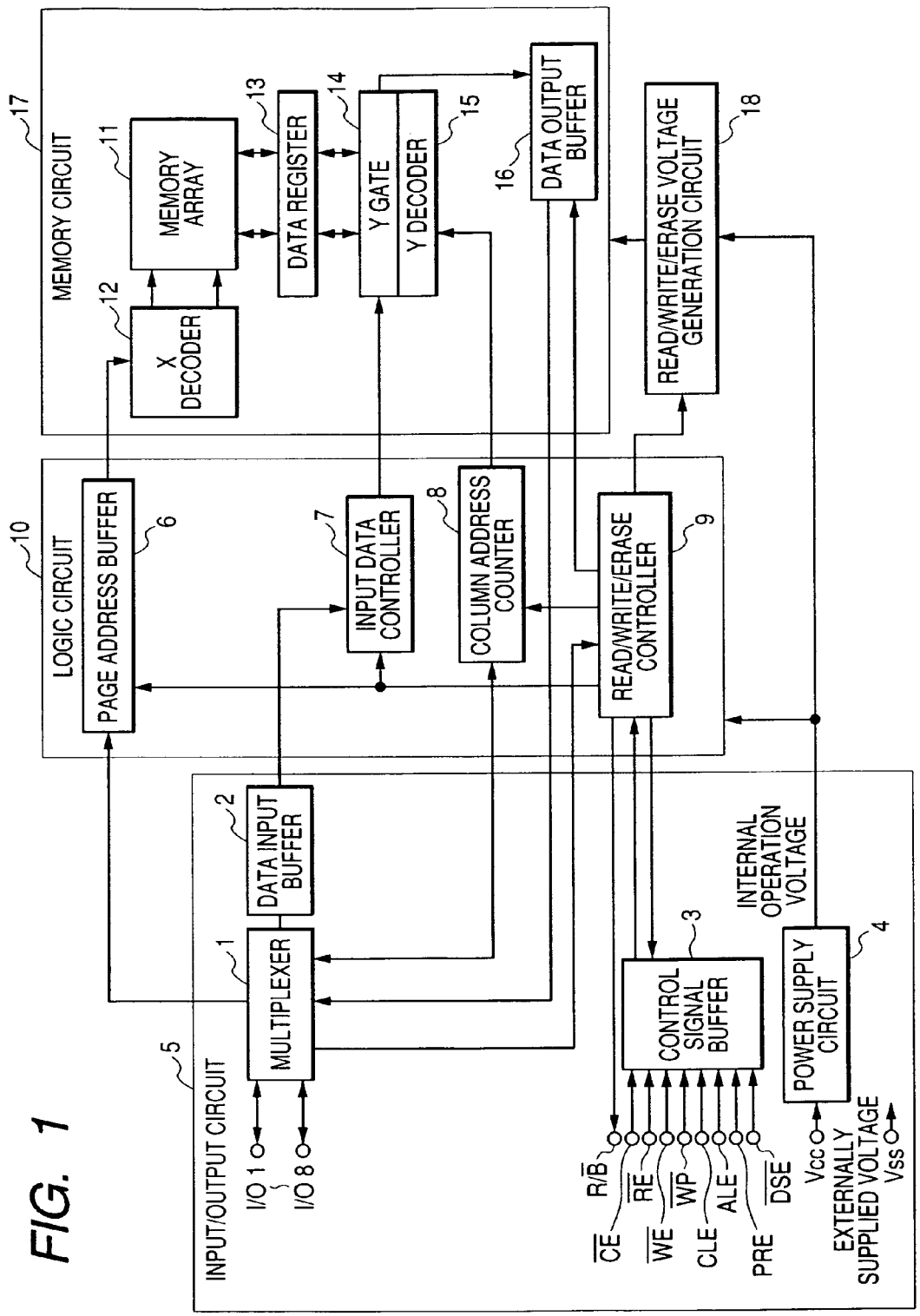
FIG. 1 is a schematic block diagram showing an embodiment 1 of a non-volatile memory according to the invention.

Embodiments of the invention are described in detail hereinafter with reference to the accompanying drawings. In all figures referred to in describing the embodiments, parts having the same functions are in principle denoted by like reference numerals, omitting repeated description thereof.

Embodiment 1

First, referring to FIG. 1, a schematic configuration of an embodiment 1 of a non-volatile memory according to the invention is described by way of example. FIG. 1 is a schematic block diagram of the non-volatile memory.

The non-volatile memory according to the embodiment 1 is made up of, for example, a flash memory comprising an input/output circuit 5 including a multiplexer 1, a data input buffer 2, a control signal buffer 3, and a power supply circuit 4; a logic circuit 10 including a page address buffer 6, an input data controller 7, a column address counter 8, and a read/write/erase controller 9; a memory circuit 17 including a memory array 11, an X decoder 12, a data register 13, a Y gate 14, a Y decoder 15, and a data output buffer 16; and a read/write/erase voltage generation circuit 18.

In the input/output circuit 5, data is delivered to, or sent out from the multiplexer 1 through respective data input-output terminals I/O 1 to I/O 8, whereupon an input or output is switched over by the multiplexer 1. Input data delivered via the multiplexer 1 is sent out to the input data controller 7 of the logic circuit 10 through the data input buffer 2. Respective control signals are delivered to the control signal buffer 3 through respective control signal input terminals CE (chip enable), RE (read enable), WE (write enable), WP (write protect), CLE (command latch enable) ALE (address latch enable), PRE (power-on auto-read enable), and DSE (deep standby enable), and from the control signal buffer 3, the control signal is sent out to the read/write/erase controller 9 of the logic circuit 10. Further, the control signal is sent out directly from the read/write/erase controller 9 through a control signal output terminal R/B (ready/busy). With reference to the respective control signals, these are inverting signals as respective symbols CE, RE, WE, WP, DSE, and B, shown by affixing a bar thereto in the figure.

With the input/output circuit 5, an externally supplied voltage is supplied to the power supply circuit 4 through a power supply terminal Vcc, and the power supply circuit 4 generates an internal operation voltage, which is supplied to the logic circuit 10, and the read/write/erase voltage generation circuit 18. Further, a ground voltage is also supplied to the input/output circuit 5 through a ground terminal Vss. For example, there is a case where the externally supplied voltage supplied through the power supply terminal Vcc is at two varieties of externally supplied voltage levels, including a 3V level and 1.8V level, and the internal operation voltage at 2.2V is generated to supply of the externally supplied voltage at either of the voltage levels to be subsequently sent out.

In the logic circuit 10, the control signals from the multiplexer 1, and the read/write/erase controller 9, respectively, are delivered to the page address buffer 6, and a page address control signal is sent out to the X decoder 12 of the memory circuit 17. Data from the data input buffer 2 and the control signal from the read/write/erase controller 9 are delivered to the input data controller 7, and an input data control signal is sent out to the Y gate 14 of the memory circuit 17. The control signal from the read/write/erase controller 9 is delivered to the column address counter 8, and a column address is sent out to the Y decoder 15 of the memory circuit 17. The control signals from the multiplexer 1, and the control signal buffer 3, respectively, are delivered to the read/write/erase controller 9, whereupon the respective control signals are sent out to the respective circuits of the logic circuit 10, the control signal buffer 3, the data output buffer 16 inside the memory circuit 17, and the read/write/erase voltage generation circuit 18.

In the memory circuit 17, the memory array 11 comprises multiple-valued memory cells for storing data of multiple-bits in one memory cell, disposed in an array at respective crossover points of word lines and bit lines. The respective memory cells inside the memory array 11 are optionally selected by the X decoder 12, Y gate 14, and Y decoder 15, whereupon reading/writing/erasing of data, respectively, are executed against the memory cell as selected. The data for reading/writing/erasing, respectively, are temporarily stored in the data register 13, and the data for read is temporarily stored in the data output buffer 16 before being sent out.

Figure 2:
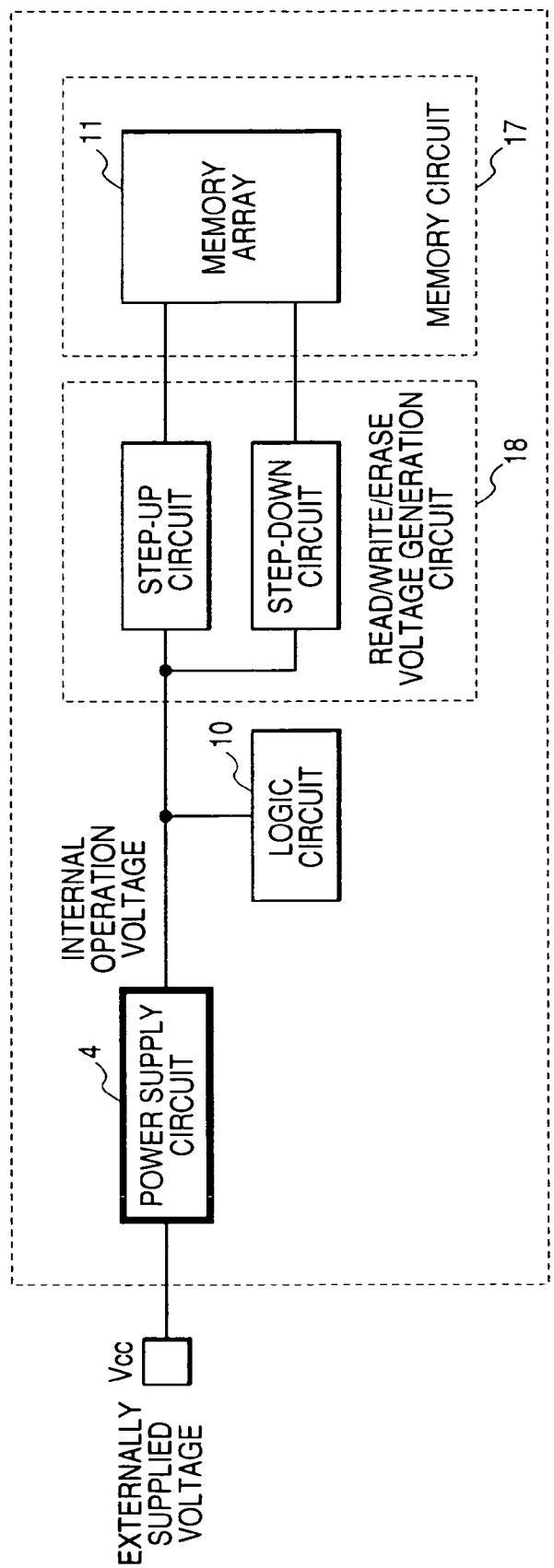
FIG. 2 is a schematic block diagram showing a power supply system in the non-volatile memory according to the embodiment 1 of the invention.

Now, referring to FIG. 2, a schematic configuration of a power supply system in the non-volatile memory according to the embodiment 1 is described by way of example. FIG. 2 is a schematic block diagram of the power supply system.

With the power supply system, the externally supplied voltage is supplied through the power supply terminal Vcc, and the internal operation voltage is generated from the externally supplied voltage by the power supply circuit 4. The internal operation voltage is supplied to the logic circuit 10, and the read/write/erase voltage generation circuit 18. In the read/write/erase voltage generation circuit 18, the internal operation voltage is either stepped up by a step-up circuit or stepped down by a step-down circuit. These voltages are used for operation voltages, such as a read voltage, a write voltage, an erase voltage, a verify voltage, and so forth, and are supplied to the memory circuit 17. In the memory circuit 17, these voltages are used for executing a read operation, a write operation, an erase operation, and so forth. For example, there is a case where the internal operation voltage is 2.2V, the read voltage is up to 5V max., the write voltage up to 15V max., and the erase voltage is down to −18V max. In this connection, the step-up circuit incorporates, for example, such a charge pump circuit (as in FIG. 9, the externally supplied voltage Vcc becomes the internal operation voltage) as explained with reference to an embodiment 2 described later on.

Subsequently, referring to FIGS. 3(a) and 3(b), distribution of threshold voltages in the multiple-valued memory cells in the non-volatile memory according to the embodiment 1 is described by way of example. FIGS. 3(a) and 3(b) are schematic illustrations of the distribution of the threshold voltages in the multiple-valued memory cells, in which FIG. 3(a) shows a case of 2-valued memory cells as a comparative example, and FIG. 3(b) shows a case of 4-valued memory cells.

The respective multiple-valued (4-valued) memory cells can store data of multiple-bits (2 bits) in one memory cell, and are capable of storing 4-valued data of "00", "01", "10", and "11" distributions, in ascending order of magnitude of the threshold voltage (Vth) distribution, as shown in FIG. 3(b), in contrast with the respective memory cells with 2-valued {the threshold voltage (Vth)} distribution of "1" and "0", as shown in FIG. 3(a).

In the write operation, for example, the "00" distribution is set to an upper end determined voltage VWE1 and a lower end determined voltage VWV1, respectively. And the "01" distribution are set to upper end determined voltage VWE2 and the lower end determined voltage VWV2, and the "10" distribution are set to upper end determined voltage VWE3 and end lower determined voltage VWV3, respectively. The "11" distribution is set to a lower end determined voltage VWV4. Further, in the read operation, for example, the read voltage Vr1 is set between the "00" distribution and the "01" distribution, the read voltage Vr2 between the "01" distribution and the "10" distribution, and the read voltage Vr3 between the "10" distribution and the "11" distribution, respectively.

Figure 4:
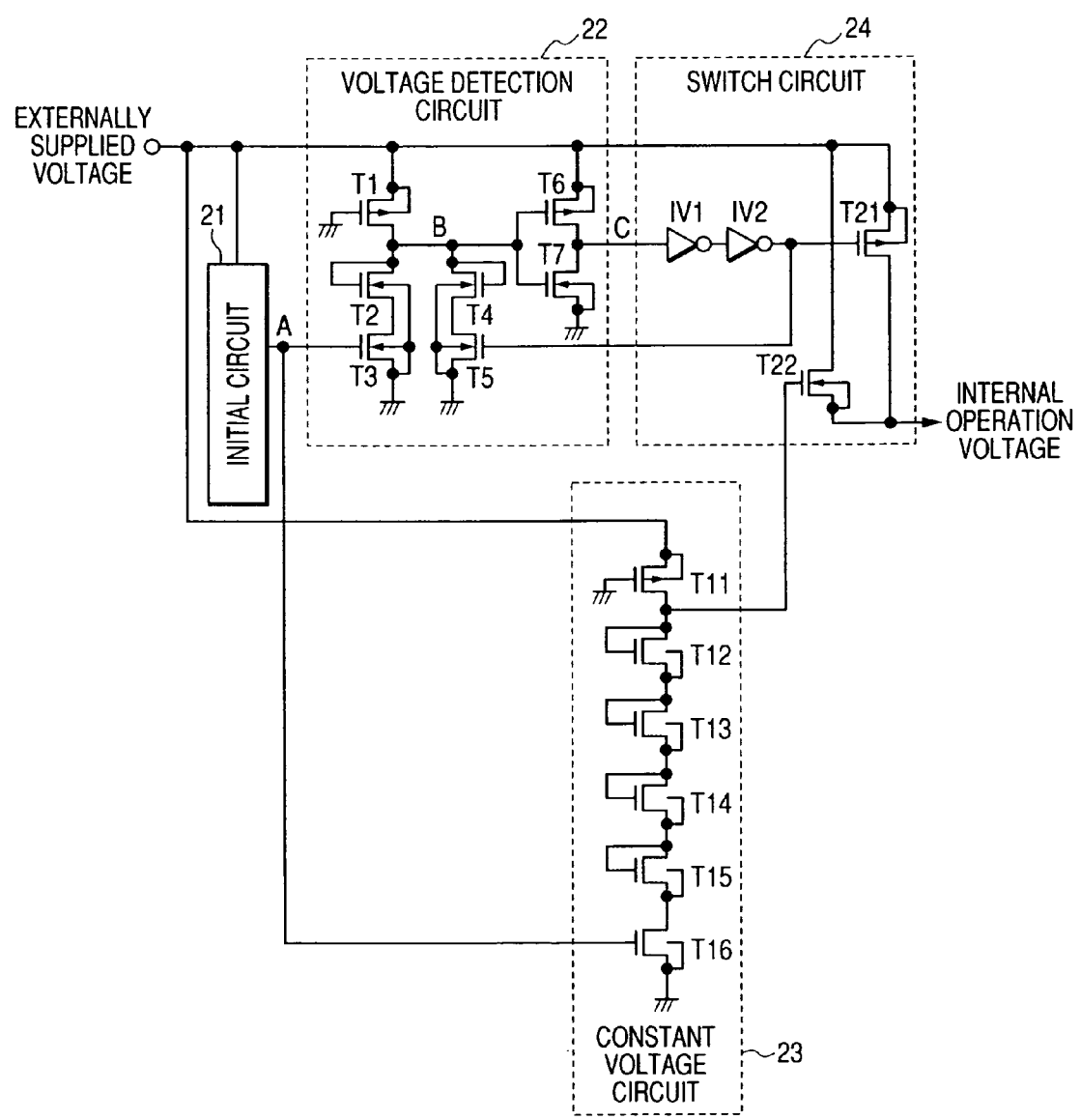
FIG. 4 is a circuit diagram of the power supply circuit in the non-volatile memory according to the embodiment 1.

Next, referring to FIG. 4, a configuration of the power supply circuit in the non-volatile memory according to the embodiment 1 is described by way of example. FIG. 4 is a circuit diagram of the power supply circuit.

The power supply circuit 4 comprises an initial circuit 21, a voltage detection circuit 22 having a hysteresis comparator, a constant voltage circuit 23 which is for example the internal step-down circuit, and a switch circuit 24. When the voltage detection circuit 22 detects the first level voltage at the externally supplied voltage rising, the internal step-down circuit starts to generate the internal operation voltage. The internal operation voltage is smaller in absolute value than the first voltage level to be subsequently supplied. And thereafter, when the voltage detection circuit 22 detects a second voltage level that is smaller in absolute value than the first voltage level, the internal step-down circuit stops generating the internal operation voltage, and the externally supplied voltage is supplied as the internal operation voltage. For example, there is a case where the first voltage level is set to 2.3V, the second voltage level to 2.1V, and the internal operation voltage to 2.2V.

The initial circuit 21 is a circuit for initializing internal circuits when power is turned on. The input of the initial circuit 21 connects to the externally supplied voltage. The output of the initial circuit 21 connects to the MOS transistor T3 of the voltage detection circuit 23 and the MOS transistor T16 of the constant voltage circuit 23 for a gate control signal of these MOS transistors.

The voltage detection circuit 22 is a circuit for detecting a voltage level of the externally supplied voltage. The voltage detection circuit 22 is configured to have the hysteresis characteristics. The voltage detection circuit 22 detects the first voltage on the rising of the externally supplied voltage, and detects the second voltage, which is lower than the first voltage, on the falling of the externally supplied voltage. The voltage detection circuit 22 comprises the hysteresis comparator made up of seven MOS transistors T1 to T7, interconnected between the power supply line for the externally supplied voltage, and a ground line, and an output line thereof is connected to an inverter IV1 of the switch circuit 24. With the seven MOS transistors T1 to T7, making up the hysteresis comparator, the gate of the MOS transistor T3 is controlled by an output signal from the initial circuit 21, and the gate of the MOS transistor T5 is controlled by a signal from the switch circuit 24.

The constant voltage circuit 23 is a circuit for generating a constant voltage to determine a voltage step-down level, comprising six MOS transistors T11 to T16, interconnected between the power supply line for the externally supplied voltage, and a ground line, and the gate of the MOS transistor T16 is controlled by the output signal from the initial circuit 21.

The switch circuit 24 is a circuit for switching over to determine whether the externally supplied voltage is to be stepped down, or the externally supplied voltage is supplied as the internal operation voltage. The switch circuit 24 comprises the inverters IV1 IV2, which are arranged in a series, and two MOS transistors T21, T22. An output signal from the voltage detection circuit 22 is inputted to the inverter IV1 in the front stage, and the output of the inverter IV2 in the back stage is connected to the gate of the MOS transistor T5 of the voltage detection circuit 22. Further, the output of the inverter IV2 in the back stage is connected to the gate of the MOS transistor T21, for use in a gate control signal. The gate of the MOS transistor T22 is connected to a node interconnecting the MOS transistors T11 and T12 inside the constant voltage circuit 23, thereby being controlled.

Figure 5:
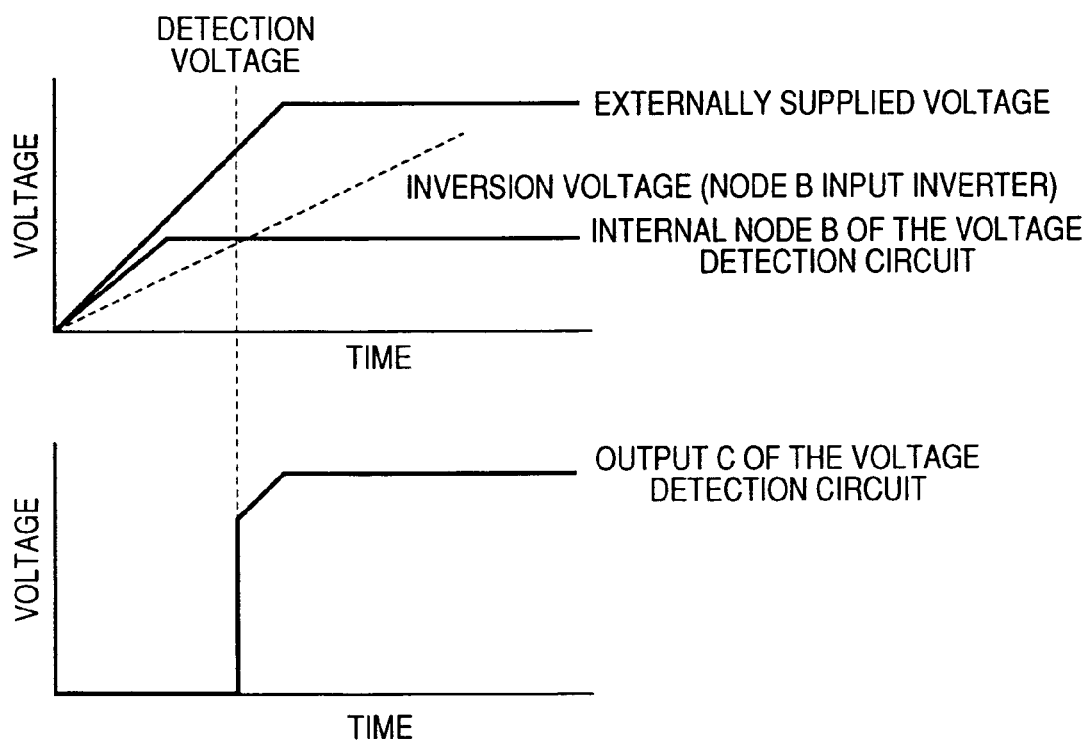
FIG. 5 is a waveform chart showing the operation of a voltage detection circuit inside the power supply circuit in the non-volatile memory according to the embodiment 1.

Now, referring to FIGS. 5, and 6, operation of the power supply circuit is described by way of example. FIG. 5 is a waveform chart showing operation of the voltage detection circuit inside the power supply circuit. FIGS. 6(a) and 6(b) are waveform charts showing the operation of the power supply circuit, in which FIG. 6(a) is a waveform chart showing a case of stepping down the externally supplied voltage, and FIG. 6(b) is a waveform chart showing a case of not stepping down the externally supplied voltage.

As shown in FIG. 5, in the case where a voltage rising in voltage level with the passage of time from a time when power is turned on to thereby become constant in predetermined time is supplied as the externally supplied voltage, an internal node B of the voltage detection circuit 22 outputs a constant voltage at a reaching the externally supplied voltage to a predetermined voltage level. An output C of the voltage detection circuit 22 undergoes a change from an "L" level to an "H" level upon the voltage exceeding a detection voltage. That is, an operation waveform of the internal node B of the voltage detection circuit 22 is smaller in rising angle than that of the externally supplied voltage, thereby becoming constant at an earlier time. The detection voltage is a voltage at a crossover point of the operation waveform of the internal node B and an inversion voltage (node B input inverter).

In FIG. 6(a), in the case where a voltage at 3.3V is supplied as the externally supplied voltage and the voltage is stepped down, the externally supplied voltage has an operation waveform rising in voltage level with the passage of time from the time when the power is turned on to thereby become constant at 3.3V. With the externally supplied voltage in such a supply condition, an output A of the initial circuit 21 undergoes a change from the "L" level to the "H" level after the passage of predetermined time from the time when the power is turned on, thereafter having the same operation waveform as that of the externally supplied voltage. Then, based on the externally supplied voltage, and the output A of the initial circuit 21, the output C of the voltage detection circuit 22 undergoes a change from the "L" level to the "H" level at a point in time, reaching the detection voltage, and thereafter, has the same operation waveform as that of the output A of the initial circuit 21. Accordingly, as for the internal operation voltage is supplied from the power supply circuit 4 by the externally supplied voltage is stepped down upon when the externally supplied voltage exceeds the detection voltage thereby.

Meanwhile, in the case where a voltage at 1.8V is supplied as the externally supplied voltage and the voltage is not stepped down, the externally supplied voltage has an operation waveform rising in voltage level with the passage of time from the time when the power is turned on to thereby become constant at 1.8V as shown FIG. 6(b). With the externally supplied voltage in such a supply condition, the output A of the initial circuit 21 undergoes a change from an "L" level to an "H" level after the passage of predetermined time from the time when the power is turned on, thereafter having the same operation waveform as that of the externally supplied voltage. Then, based on the externally supplied voltage, and the output A of the initial circuit 21, the output C of the voltage detection circuit 22 does not reach the detection voltage, so that the same maintains the "L" condition. Accordingly, the power supply circuit 4 supplies the externally supplied voltage as the internal operation voltage, since the externally supplied voltage does not exceed the detection voltage.

Figures 7A, 7B:
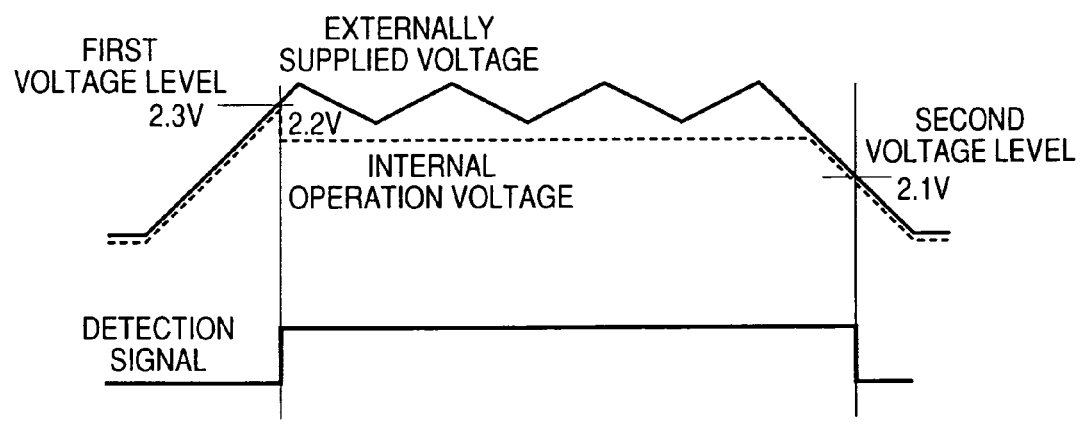
FIGS. 7(*a*), and 7(*b*) are schematic illustrations showing stability in operation for switching over between the externally supplied voltages in the case of the non-volatile memory according to the embodiment 1, in which FIG. 7(*a*) shows a relationship between a voltage waveform and a detection voltage, and FIG. 7(*b*) shows generation of an internal operation voltage, corresponding to levels of the detection voltage.

Next, referring to FIGS. 7(a), and 7(b), there is described stability in operation for switching over between the externally supplied voltages in the power supply circuit. FIGS. 7(a), and 7(b) are schematic illustrations showing the stability in the operation for switching over between the externally supplied voltages, in which FIG. 7(a) shows a relationship between a voltage waveform and the detection voltage, and FIG. 7(b) shows generation of the internal operation voltages, corresponding to levels of the detection voltage, respectively.

With the embodiment 1, since the power supply circuit 4 comprises the hysteresis comparator as described previously, having two voltage levels of, for example, 2.3V, and 2.1V, as the threshold voltage, the detection signal goes to the "H" level upon detection of the first voltage level at 2.3V at a time when the externally supplied voltage rises, whereupon the internal step-down circuit comes into action, thereby generating the internal operation voltage at 2.2V to be subsequently supplied. Thereafter, upon detection of the second voltage level at 2.1V, the detection signal goes to the "L" level, whereupon the externally supplied voltage is supplied as the internal operation voltage. Accordingly, because the detection signal remains in the "H" condition even when the externally supplied voltage is unstable in the vicinity of 2.3V, the switch circuit 24 does not act even when the externally supplied voltage falls while the externally supplied voltage is stepped down to be internally supplied, so that the internal operation voltage does not undergo variation.

Thus, with the non-volatile memory according to the embodiment 1, by adoption of the hysteresis comparator having two voltage levels for the threshold voltage, it is possible to inhibit unstable operation in the vicinity of the threshold voltage at a time of switching over to determine whether the externally supplied voltage is to be stepped down, or the externally supplied voltage, as it is, is to be supplied as the internal operation voltage, so that the operation in the vicinity of the threshold voltage for switching over between the externally supplied voltages can be stabilized.

Further, since the internal operation voltage does not undergo variation, internal voltages at times for writing/erasing, respectively, obtained by stepping up the internal operation voltage, becomes stable, thereby enabling writing operation/erasing operation to be stabilized.

Furthermore, assuming a case of battery operation by mounting a non-volatile memory similar to that according to the embodiment 1 on a memory card and so forth, and using the same as an external storage medium of a personal computer, portable equipment, and so forth, an externally supplied voltage is prone to become unstable as compared with a case of operation based on an AC power supply source, so that the non-volatile memory according to the present embodiment has large advantageous effects particularly when applied to dual voltage products for battery operation.

Embodiment 2

Figure 8:
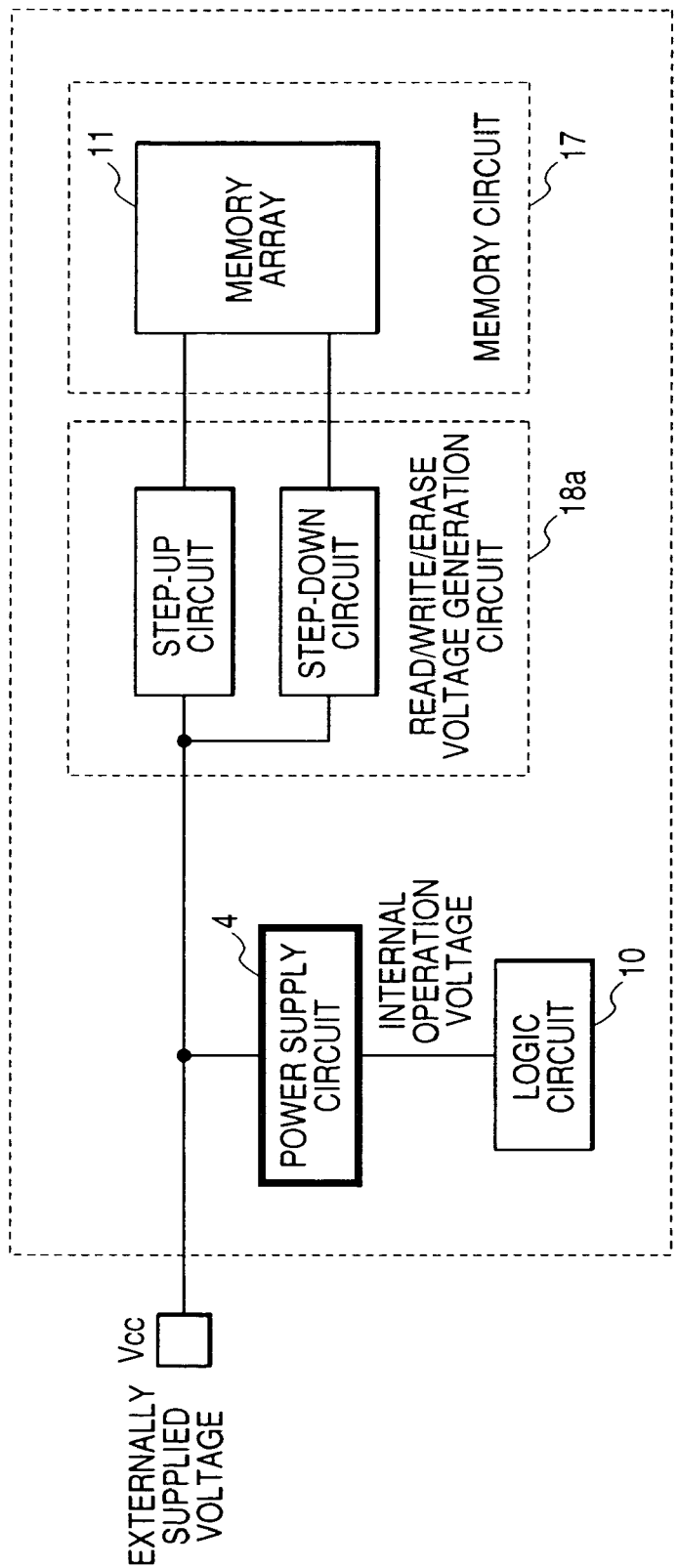
FIG. 8 is a schematic block diagram showing a power supply system in a non-volatile memory according to an embodiment 2.

First, referring to FIG. 8, a schematic configuration of a power supply system in a non-volatile memory according to an embodiment 2 is described by way of example. FIG. 8 is a schematic block diagram of the power supply system.

The non-volatile memory according to the embodiment 2 differs from that according to the embodiment 1 in that an internal operation voltage generated from an externally supplied voltage is supplied only to the logic circuit 10, and the externally supplied voltage is supplied directly to the read/write/erase voltage generation circuit 18. In respect of other configurations and the functions of respective circuits, the embodiment 2 is the same as the embodiment 1.

More specifically, with the power supply system of the non-volatile memory according to the embodiment 2, the externally supplied voltage is supplied through a power supply terminal Vcc, the internal operation voltage is generated from the externally supplied voltage through the power supply circuit 4, and the internal operation voltage is supplied to the logic circuit 10. Further, the externally supplied voltage is supplied directly to a read/write/erase voltage generation circuit 18a, in which the externally supplied voltage is either stepped up by a step-up circuit or stepped down by a step-down circuit, thereby generating various operation voltages, such as a read voltage, a write voltage, an erase voltage, a verify voltage, and so forth, to be subsequently supplied to a memory circuit 17. In the memory circuit 17, respective voltages as generated are used for executing a read operation, a write operation, an erase operation, and so forth.

Figure 9:
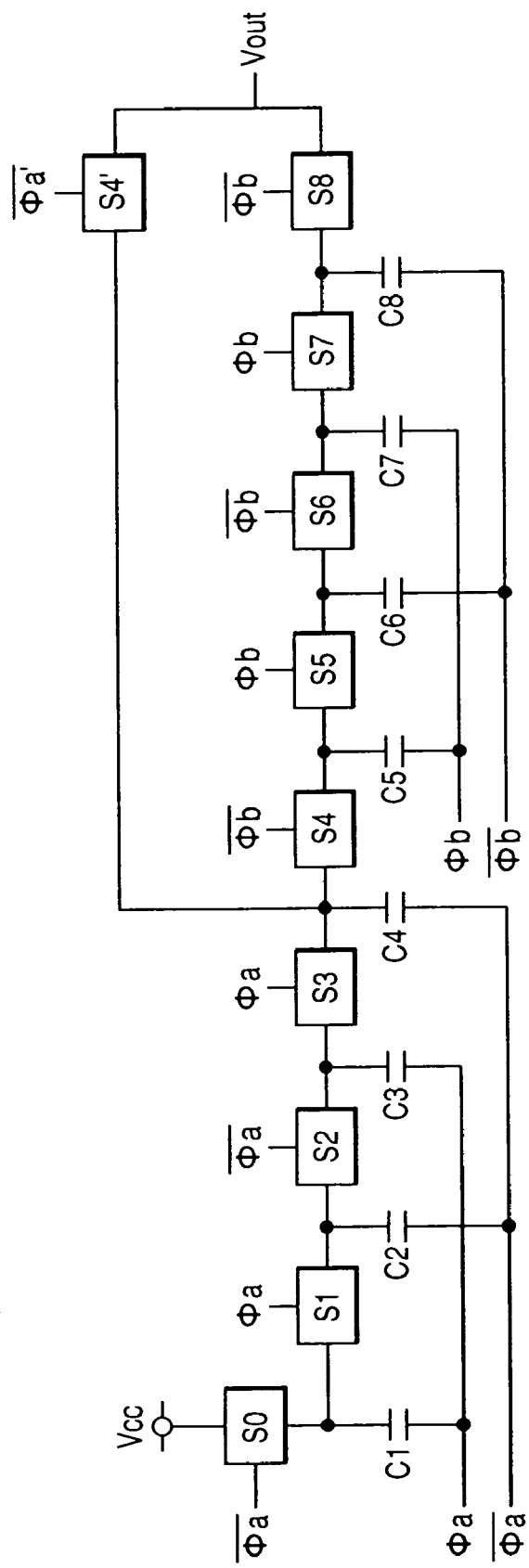
FIG. 9 is a circuit diagram showing a charge pump circuit inside a read/write/erase voltage generation circuit in the non-volatile memory according to the embodiment 2.

Next, referring to FIG. 9, a configuration of the charge pump circuit inside the read/write/erase voltage generation circuit is described by way of example. FIG. 9 is a circuit diagram showing the charge pump circuit inside the read/write/erase voltage generation circuit.

The read/write/erase voltage generation circuit 18a incorporates the charge pump circuit for stepping up the externally supplied voltage. The charge pump circuit comprises a plurality of capacitive elements C1 to C8, and a plurality of switching circuits S0 to S8, S4', acting so as to correspond to the externally supplied voltage, and is configured so as to act as a pump with four stages as the number of step-up stages (four-stage configuration with a pair of the respective capacitive elements C1 to C4 and the respective switching circuits S1 to S3, S4') when 3V is supplied while acting as a pump with eight stages as the number of step-up stages (eight-stage configuration with a pair of the respective capacitive elements C1 to C8 and the respective switching circuits S1 to S8) when 1.8V is supplied.

For example, at a time of operation at 3V, by controlling such that control signals Φa, /Φa, and /Φa' are activated while control signals Φb, /Φb are deactivated, the switching circuits S1 to S3, S4' in four stages are caused to act to thereby supply voltage charged in the capacitive elements C1 to C4, thereby causing the charge pump circuit to act as the pump with four stages as the number of the step-up stages. Meanwhile, at a time of operation at 1.8V, by controlling such that the control signals Φa, /Φa, Φb, and /Φb are activated while the control signal /Φa' is deactivated, the switching circuits S1 to S8 in eight stages are caused to act to thereby supply voltage charged in the capacitive elements C1 to C8, thereby causing the charge pump circuit to operate as the pump with eight stages as the number of the step-up stages.

Consequently, with the non-volatile memory according to the embodiment 2, it is possible to obtain the same advantageous effects as those for the embodiment 1, and in particular, while the logic circuit 10 can stably operate by keeping an operation voltage unchanged, the charge pump circuit can be improved in efficiency by supplying the externally supplied voltage directly to the read/write/erase voltage generation circuit 18a.

While the invention developed by the inventors has been particularly described with reference to the preferred embodiments, as described in the foregoing, it is obvious that the invention is not limited thereto, and that various changes and modifications may be made in the invention without departing from the spirit and scope thereof.

For example, with the preferred embodiments described above, the flash memory has been described as an example of the non-volatile memory, however, the invention is applicable to a non-volatile memory, and so forth, such as an EEPROM, and the like.

What is claimed is:

1. A nonvolatile memory incorporated in a memory card used for a mobile device, comprising:
    a nonvolatile memory array;
    a switch circuit;
    a voltage detector circuit which issues a signal to said switch circuit; and
    a voltage generator,
    wherein the voltage generator generates a first voltage for supplying to the nonvolatile memory array based on an operation voltage supplied from outside the nonvolatile memory,
    wherein the voltage detector circuit changes the signal from a first state to a second state when the operation voltage becomes high and reaches a first voltage level, and changes the signal from the second state to the first state when the operation voltage becomes low and reaches a second voltage level which is lower than the first voltage level; and
    wherein in response to said signal from said voltage detector circuit, said switch circuit switches an output of said switch circuit between said operation voltage supplied from outside the nonvolatile memory and a stepped-down voltage that is based on said operation voltage supplied from outside the nonvolatile memory.

2. A nonvolatile memory according to claim 1, further comprising a logic circuit, and
    wherein the voltage generator further generates a second voltage for supplying to the logic circuit.

3. A nonvolatile memory according to claim 2,
    wherein the first voltage is used for writing data to the nonvolatile memory array.

4. A nonvolatile memory according to claim 3,
    wherein the voltage generator comprises a charge pump circuit, and changes a number of steps of the charge pump circuit in accordance with the state of said signal.

5. A nonvolatile memory according to claim 4,
    wherein the number of steps of the charge pump for the signal having the first state is larger than the number of steps of the charge pump for the signal having the second state.

* * * * *